(12) United States Patent
Li

(10) Patent No.: US 6,525,944 B1
(45) Date of Patent: Feb. 25, 2003

(54) WINDOWED PACKAGE FOR ELECTRONIC CIRCUITRY

(75) Inventor: Zong-Fu Li, Gilbert, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/676,105

(22) Filed: Sep. 29, 2000

(51) Int. Cl.⁷ .................................................. H05K 7/02
(52) U.S. Cl. ...................... 361/760; 361/764; 361/767; 361/803; 385/132; 385/134; 385/135
(58) Field of Search .................................. 361/760, 764, 361/767, 775, 783, 784, 803, 675, 701, 709, 714, 718, 719; 385/14, 135, 134, 132

(56) References Cited

U.S. PATENT DOCUMENTS

| 5,200,631 A | * | 4/1993 | Austin et al. ................. 257/81 |
| 5,923,796 A | * | 7/1999 | Feldman et al. .............. 385/14 |
| 5,949,655 A | * | 9/1999 | Glenn ......................... 361/783 |

* cited by examiner

Primary Examiner—David Martin
Assistant Examiner—Hung Bui
(74) Attorney, Agent, or Firm—Blakely, Sokoloff, Taylor & Zafman LLP

(57) ABSTRACT

An apparatus and method for enabling interaction between electronic circuitry and optical signals with a package for enclosing the electronic circuitry having contacts and a window for the passage of optical signals disposed about a face of the package that becomes substantially inaccessible when the package is used.

17 Claims, 4 Drawing Sheets

WINDOWED PACKAGE FOR ELECTRONIC CIRCUITRY

FIELD OF THE INVENTION

The present invention is related to an apparatus and method for communicating optical signals to an electronic device enclosed within a flip-chip package.

ART BACKGROUND

Commonly available electronic devices exist in the form of a thin sheet of semiconductor material, or die, with electronic circuitry disposed thereon by way of various photolithographic processes. To protect the circuitry from damage, the die is often enclosed in a package designed to facilitate the attachment of the electronic device to a printed circuit board of a computer system or other electronic system.

Within some electronic devices are components meant to produce optical signals to be transmitted outside of the package, or to receive optical signals to be received from outside of the package. Packages have been used that provide a window through which such signals may pass. The window of such packages typically faces outwardly from the package in a direction that is generally meant to face away from the printed circuit board to which the electronic device is to be attached. One of the most common examples of such electronic devices enclosed within such a package is an ultaviolet-eraseable programmable read-only memory or UV-EPROM.

FIG. 1 is a cross-sectional view of a prior art package of the dual inline pin (DIP) type. The exterior or package 100 is comprised of window 110 and shell 112. Die attach 114 attaches die 130 to an inner surface of shell 112, thereby securing die 130 to the interior of package 100. Bonding wires 120 provide part of the electrical connections between die 130 and solder balls 122. Die 130 is positioned within package 100 such that the surface on which electronic circuitry (not shown) has been disposed is caused to face window 110 to allow the transmission or receipt of optical signal 132. Pins 122 are used to attach package 100 to printed circuit board 140 through which are holes to receive the pins, and as a result, window 110 faces away from printed circuit board 140.

The use of such packages, however, is based on a longstanding practice of having the surface of the die on which electronic circuitry is disposed facing away from the printed circuit board to which the electronic device is attached, thereby making this surface of the die accessible to optical signals passing through the window of the package. More recently, however, flexibility in power consumption and die size, as well as improvements in electrical signal characteristics, have been realized through the use of packages, such as the "flip-chip" or the "controlled collapsed chip connection" (C4) package, in which the surface of the die on which electronic circuitry is disposed now faces towards the printed circuit board to which the electronic device is to be attached.

BRIEF DESCRIPTION OF THE DRAWINGS

The objects, features, and advantages of the present invention will be apparent to one skilled in the art in view of the following detailed description in which.

DETAILED DESCRIPTION

In the following description, for purposes of explanation, numerous details are set forth in order to provide a thorough understanding of the present invention. However, it will be apparent to one skilled in the art that these specific details are not required in order to practice the present invention. In other instances, well known electrical structures and circuits are shown in block diagram form in order not to obscure the present invention unnecessarily.

The present invention concerns "flip-chip" or "controlled collapsed chip connection" (C4) packages for integrated circuits, wherein the surface of a die on which electronic circuitry has been disposed is positioned such that it faces towards the circuit board to which the package will be attached during use of the electronic circuitry. The present invention further concerns the addition of a window to such a package on the side of the package that faces towards the circuit board to enable the transmission of optical signals to and from the electronic circuitry.

Figure 1:
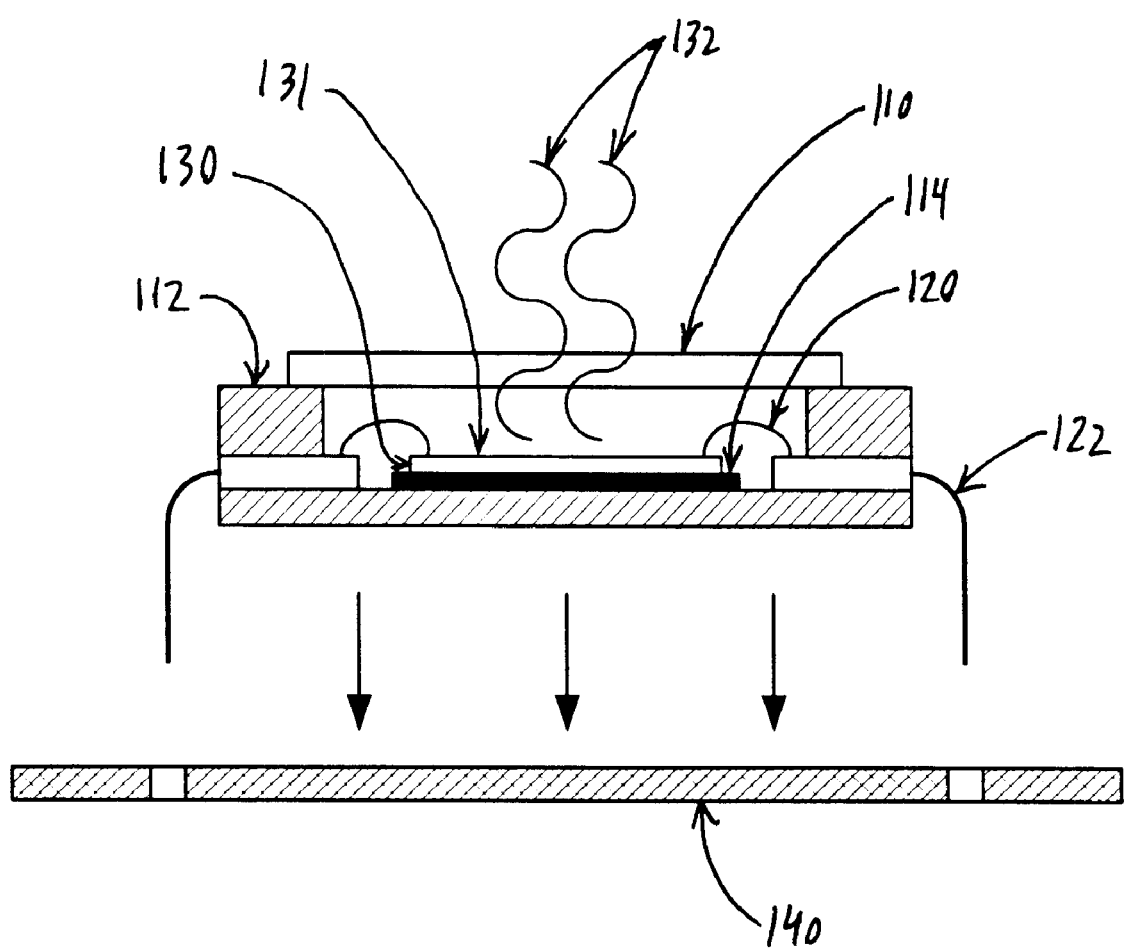
FIG. 1 is cross-sectional view of a prior art ball grid array package.
Figure 2:
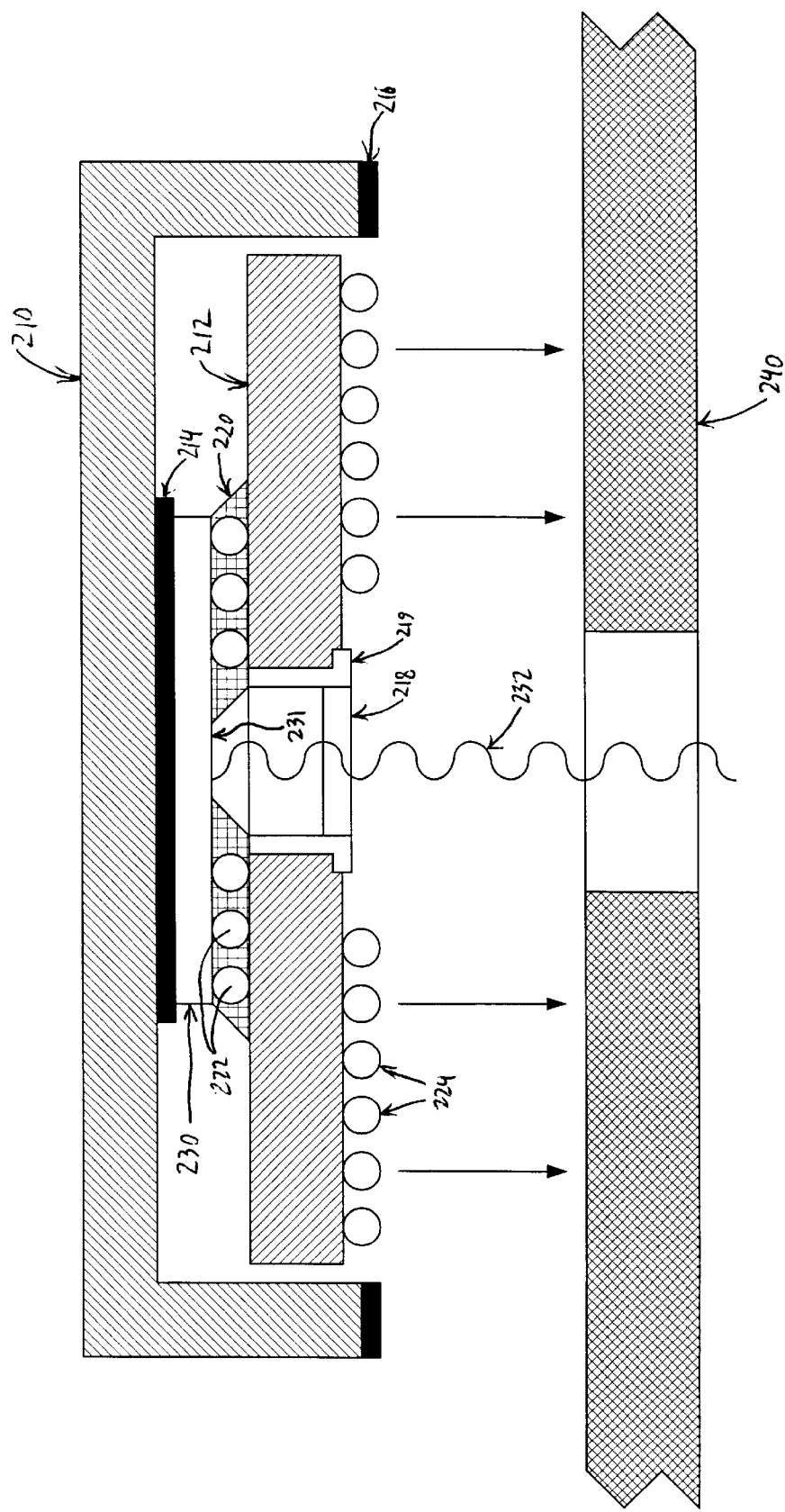
FIG. 2 cross-sectional view of one embodiment of the present invention.

FIG. 2 is a cross-sectional view of one embodiment of the present invention. The exterior of package 200 is comprised of shell 210 and substrate 212. Die attach 214 holds die 230 in place within package 200 such that the surface of die 230 on which electronic circuitry has been disposed faces towards substrate 212. Underfill 220 and solder balls 222 attach die 230 to substrate 212, with solder balls 222 providing electrical connections between die 230 and substrate 212. Substrate 212 is a printed circuit board with conductors forming electrical connections between solder balls 222 and solder balls 224. Mounted within and through substrate 212 is window frame 219, in which window 218 is mounted, which allows optical signal 232 to pass between the exterior of package 200 and exposed die portion 231 of die 230 where electronic circuitry capable of interacting with optical signal 232 has been disposed.

In one embodiment, exposed die portion 231 comprises less than all of the surface of the die that faces window 218, while in an alternate embodiment, exposed die portion 231 comprises the entire surface of the die that faces window 218.

In one embodiment, die attach 214 is a thermal grease, such as silicone, and shell 210 is a heatsink made of material capable of conducting heat away from die 230, such as copper or aluminum.

In one embodiment, window 218 is made of glass, while in alternative embodiments, window 218 is made of plastic or a combination of glass and plastic. In one embodiment, the material of which window 218 is made is chosen to be transparent for optical signals of a specific frequency or frequencies, while in an alternative embodiment, the material of which window 218 is made is chosen to be transparent for a substantially wider range of frequencies.

In one embodiment, the external surface of window 218 is mounted flush with the external surface of window frame 219. In an alternative embodiment, window 218 is recessed within window frame 219 to permit the insertion of an optical conductor, an assembly of lenses, an optoelectronic device, or other apparatus protruding through the opening in printed circuit board 240. In still another alternative embodiment, a micromechanical device for manipulating optical signal 232, such as a micromirror (not shown), is positioned within window frame 219, either behind or in place of window 218.

In one embodiment, window frame 219 is made of ceramic material having a thermal coefficient substantially similar to that of die 230. In this embodiment, shell 210 and window frame 219 cooperate to restrict the expansion of substrate 212 in response to heat emanating from die 230 during operation of the electronic circuitry disposed onto die 230. This ensures that substrate 212 maintains its shape and remains correctly aligned with die 230.

In one embodiment, window 218, window frame 219, underfill 220 and exposed die portion 231 define a cavity through which optical signal 232 is transmitted. In one embodiment surface tension from the edges of the die and the inner edge of window frame 219 prevents underfill 220 from overflowing and thereby blocking exposed die portion 231. Alternatively, exposed die portion 231 is treated with a low surface energy coating, such as a flour-carbon (CFx) deposition. Regardless of whether surface tension or a low surface energy coating is used, underfill 220 may be of a material commonly used as underfill in typical flip-chip or C4packages.

In one embodiment, adhesive 216 and solder balls 224 attach package 200 to printed circuit board 240. Solder balls 224 provide electrical connections between substrate 212 and electrical contacts disposed on printed circuit board 240. In a further embodiment, an opening is provided through printed circuit board 240 to permit optical signal 232 to pass therethrough, thereby enabling the exchange of optical signals between die 230 and other devices (not shown) positioned on the opposite side of printed circuit board 240.

In one embodiment, printed circuit board 240 is a rigid laminate of electrically conductive materials and electrical insulators. In an alternative embodiment, printed circuit board 240 is a flexible laminate of such materials. In another alternative embodiment, printed circuit board 240 is replaced with solid piece of electrical insulator upon which electrical contacts are disposed for making electrical connections with solder balls 224.

In one embodiment, circuitry comprising the core logic (e.g., random access memory controller, bus interface, I/O device interface, or timers) of a microcomputer system is disposed on a surface of die 230 with circuitry capable of interacting with optical signals being disposed on exposed die portion 231. In another embodiment, circuitry comprising a central processing unit of a microcomputer system is disposed on a surface of die 230 with circuitry capable of interacting with optical signals being disposed on exposed die portion 231.

In one embodiment, package 200 is assembled by first designing and fabricating package 200 with an opening in substrate 212 for window frame 219. Then by fitting window frame 219 and window 218 into substrate 212. Then by attaching die 230 to substrate 212 by way of solder balls 222 using a typical C4process. Then by filling the area among solder balls 222 with underfill 220 and curing underfill 220.

In one embodiment, package 200 is attached to printed circuit board 240 by first attaching package 200 via solder balls 224 to printed circuit board 240 by way of typical surface mount soldering techniques. Then by applying die attach 214 to surface of die 230 that is to be attached to shell 210. Then by applying adhesive 216 to the surface of shell 210 that is to be attached to printed circuit board 240. Then by attaching shell 210 to both die 230 and printed circuit board 240 and curing adhesive 216.

Figure 3:
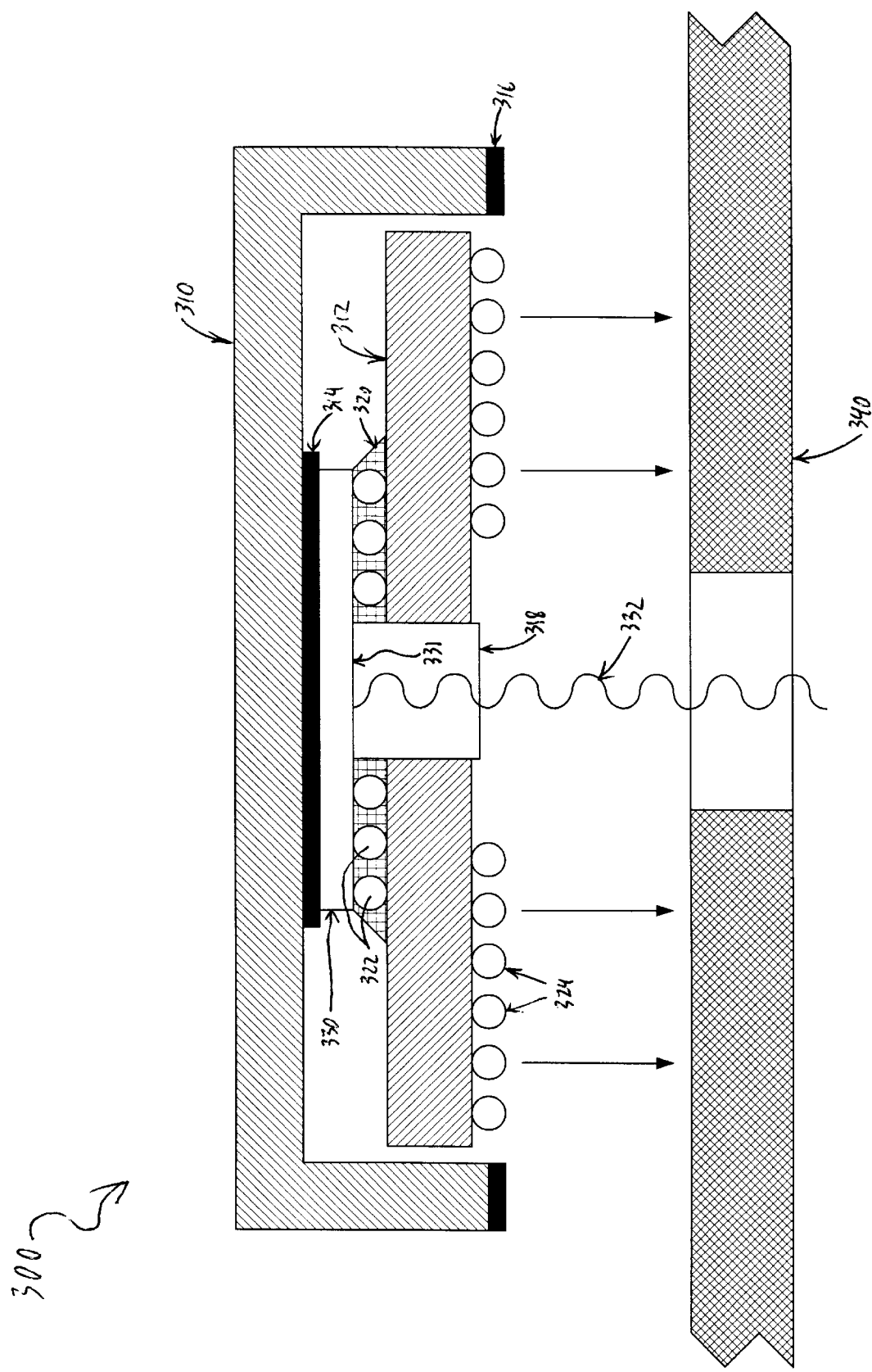
FIG. 3 is a cross-sectional view of another embodiment of the present invention.

FIG. 3 is a cross-sectional view of another embodiment of the present invention. Most of the numbered elements of FIG. 3 substantially correspond to those of FIG. 2 with the exception that window frame 219 and window 218 have been replaced with window 318. Just as window frame 219 and window 218 served to allow die 230 to interact with optical signal 232 in the embodiment depicted in FIG. 2, window 318 serves to allow die 330 to interact with optical signal 332 in the embodiment depicted in FIG. 3. However, unlike the embodiment of FIG. 2, where window 218, window frame 219, underfill 220 and exposed die portion 231 defined a cavity, as earlier described, no such cavity is defined in FIG. 3.

In one embodiment, window 318 is made of a material with a thermal coefficient substantially similar to that of die 330, and window 318 cooperates with shell 310 to restrict the expansion of substrate 312 in the same way in which window frame 219 and shell 210 restricted the expansion of substrate 212 in FIG. 2.

Figure 4:
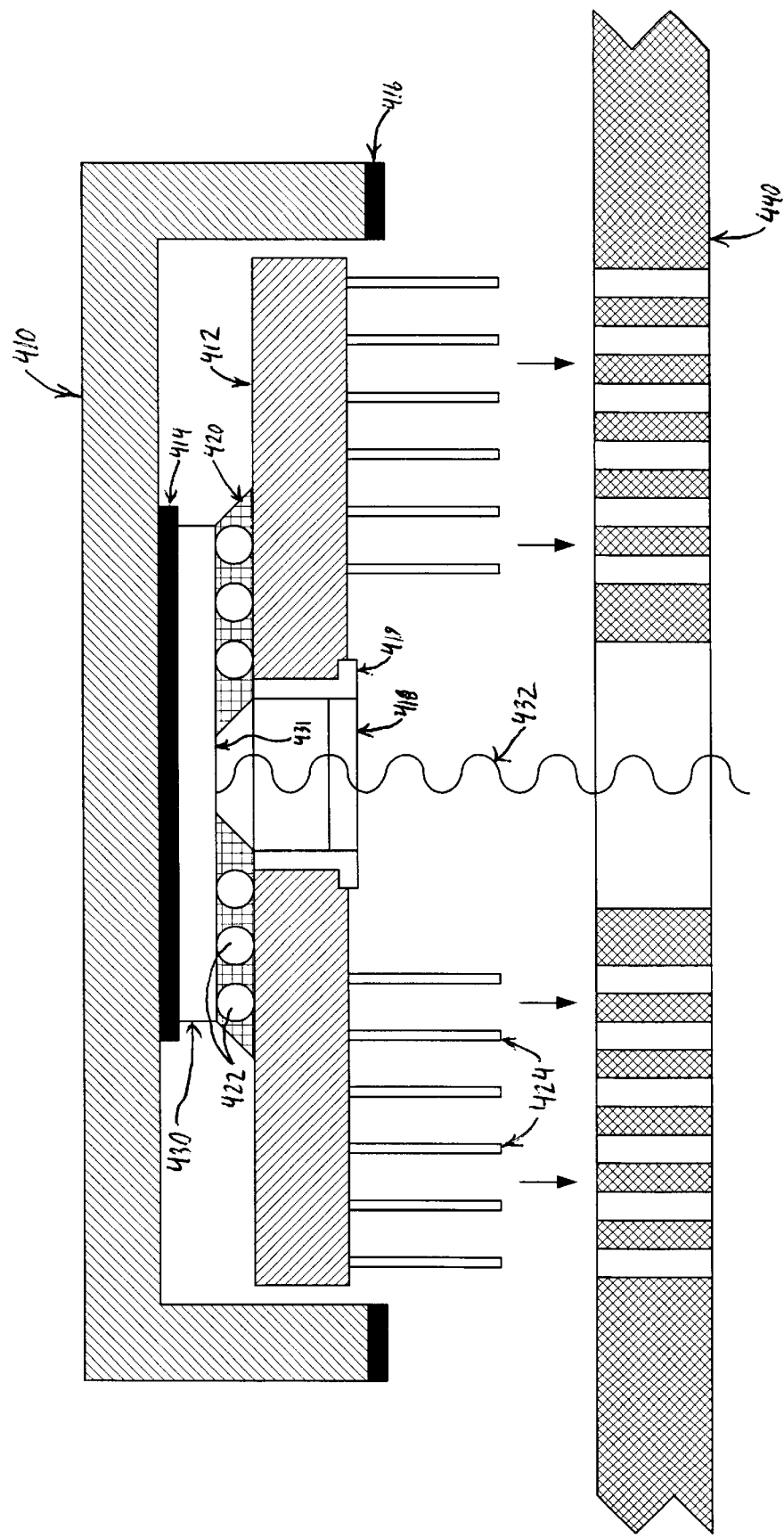
FIG. 4 is a cross-sectional view of yet another embodiment of the present invention.

FIG. 4 is a cross-sectional view of another embodiment of the present invention. Most of the numbered elements of FIG. 4 substantially correspond to those of FIG. 2 with the exception that pins 424 have been substituted for solder balls 224 of FIG. 2. However, unlike printed circuit board 240 of FIG. 2, additional openings (e.g., plated through-holes) have been provided in printed circuit board 440 to receive pins 424. In one embodiment, printed circuit board 440 is a rigid laminate of electrically conductive materials and electrical insulators. In an alternative embodiment, printed circuit board 440 is a flexible laminate of such materials. In another alternative embodiment, printed circuit board 440 is replaced with solid piece of electrical insulator through which electrical contacts are disposed for making electrical connections with pins 424.

Just as solder balls 224 of FIG. 2 served to attach package 200 to printed circuit board 240, pins 424 serve to attach package 400 to printed circuit board 440. Also, just as solder balls 224 served as electrical contacts providing a portion of the electrical connections between die 230 and electrical contacts disposed on printed circuit board 240, pins 424 serve as electrical contacts providing a portion of the electrical connections between die 430 and electrical contacts disposed through printed circuit board 440.

In the depicted embodiment, package 400 is attached directly to printed circuit board 440. However, in an alternate embodiment, a socket (not shown) that is designed to receive pins 424 is interposed between package 400 and printed circuit board 440. In one embodiment, this socket would, in turn, be comprised of pins by which it would be attached to printed circuit board 440, just as package 400 would have been.

The invention has been described in conjunction with the preferred embodiment. It is evident that numerous alternatives, modifications, variations and uses will be apparent to those skilled in the art in light of the foregoing description. It will be understood by those skilled in the art, that the present invention may be practiced in support of other combinations of functions in a computer system.

The example embodiments of the present invention are described in the context of ball grid array and pin grid array packages for electronic devices that are comprised of components for sending or receiving optical signals. However, the present invention is applicable to a variety of package types and to a variety of electronic, microelectronic, optical, optoelectronic and micromechanical devices. The term optical should not be taken to be limited to encompassing only signals with frequencies within the visible spectrum of light, for the present invention is applicable to use with light of a variety of frequencies, including infrared and ultra-violet. Although the present invention is described in the context of packages attached to rigid printed circuit boards that are commonly in use, the present invention is also applicable to packages being attached to sheets of flexible material or other surfaces providing electrical connections. Also, although the present invention is described in the context of having electronic circuitry disposed onto a single surface of a die composed substantially of semiconductor material, thereby requiring that single surface to be oriented to face the window of the package, it will be understood by those skilled in the art that electronic circuitry may be positioned within a package using a variety of means and in a variety of orientations without departing from the spirit of the invention as hereinafter claimed. Furthermore, although the present invention is described in the context of packages that enclose a single die on which electronic circuitry is disposed, the present invention is applicable to packages enclosing multiple separate dies, and/or dies comprised of smaller dies.

What is claimed is:

1. An apparatus comprising:
   circuitry disposed upon a first surface of a die made substantially of semiconductor material, wherein the circuitry is capable of interacting with optical signals; and
   a package to enclose the die with the first surface of the die oriented to face a window in a first external face of the package enabling passage of optical signals between the interior and exterior of the package, wherein the package has electrical contacts disposed about the exterior of the package such that the first external face of the package is substantially covered by other apparatus when the contacts are used to attach the package to the other apparatus, wherein the first external face of the package is made of a substrate with a thermal coefficient dissimilar to that of the die to an extent that the substrate may come out of alignment with the die in response to heat emanating from the die, and wherein at least one portion of the window is made of a material with a thermal coefficient substantially similar to that of the die.

2. The apparatus of claim 1 wherein the package is a ball grid array package, wherein the contacts disposed about the exterior of the package are solder balls, and wherein the solder balls are disposed on the first external face of the package.

3. The apparatus of claim 1, wherein the package is a pin grid array package, wherein the contacts disposed about the exterior of the package are pins, and wherein the pins are disposed on the first external face of the package.

4. The apparatus of claim 1, wherein the package is also comprised of a heatsink which cooperates with the at least one portion of the window to preserve the alignment of the substrate.

5. The apparatus of claim 1, wherein the other apparatus comprises a printed circuit board to which the package is attached and through which an opening aligned with the window is provided enabling the optical signals to pass therethrough.

6. A method comprising:
   disposing circuitry upon a first surface of a die made substantially of semiconductor material, wherein the circuitry is capable of interacting with optical signals;
   enclosing the die in a package with the first surface of the die oriented to face a window provided in a first external face of the package to enable passage of optical signals between the interior and exterior of the package, wherein electrical contacts are disposed about the exterior of the package such that the first external face of the package is substantially covered by other apparatus when the contacts are used to attach the package to the other apparatus; and
   using a material with a thermal coefficient that is substantially similar to the thermal coefficient of the die to make at least one portion of the window.

7. The method of claim 6, further comprising using a heatsink in cooperation with the at least one portion of the window to preserve the alignment of the substrate.

8. The method of claim 6, further comprising attaching the package to a printed circuit board through which an opening substantially aligned with the window is provided enabling optical signals to pass therethrough.

9. The method of claim 8, further comprising placing other apparatus meant to interact with the die using the optical signals on the opposite side of the printed circuit board at a position substantially aligned with the window.

10. The method of claim 8, further comprising inserting other apparatus meant to interact with the die using the optical signals through the opening through the printed circuit board.

11. An electronic system comprising:
    a printed circuit board to which electronic devices are attached, and having an opening therethrough;
    a bus coupling electronic devices;
    circuitry disposed upon a first surface of a die made substantially of semiconductor material, wherein the circuitry is capable of interacting with optical signals; and
    a package to enclose the die with the first surface of the die oriented to face a window in a first external face of the package enabling passage of optical signals between the interior and exterior of the package, wherein electrical contacts are disposed about the exterior of the package such that the first external face of the package is substantially covered by other apparatus when the contacts are used to attach the package to the other apparatus, wherein at least one portion of the window is made of a material with a thermal coefficient substantially similar to that of the die, and wherein the window is aligned with the opening through the printed circuit board.

12. The electronic system of claim 11, wherein the package is a ball grid array package, wherein the contacts disposed about the exterior of the package are solder balls, and wherein the solder balls are disposed on the first external face of the package.

13. The electronic system of claim 11, wherein the package is a pin grid array package, wherein the contacts disposed about the exterior of the package are pins, and wherein the pins are disposed on the first external face of the package.

14. An apparatus comprising:
    a package to enclose circuitry disposed upon a first surface of a die made substantially of semiconductor material, wherein the die is positioned such that the first surface of the die is positioned to face the interior surface of a window on a first external face of the package, the window enabling passage of optical signals between the interior and exterior of the package, and electrical contacts disposed about the exterior of the package such that the first external face of the package is substantially covered by other apparatus when the contacts are used to attach the package to the other apparatus, wherein the first external face of the package is made of a substrate with a thermal coefficient dissimilar to that of the die to an extent that the substrate may come out of alignment with the die in response to heat emanating from the die, and wherein at least one portion of the window is made of a material with a thermal coefficient substantially similar to that of the die.

15. The apparatus of claim 14, wherein the package is a ball grid array package, wherein the contacts disposed about the exterior of the package are solder balls, and wherein the solder balls are disposed on the first external face of the package.

16. The apparatus of claim 14, wherein the package is a pin grid array package, wherein the contacts disposed about the exterior of the package are pins, and wherein the pins are disposed on the first external face of the package.

17. The apparatus of claim 14, wherein the package is also comprised of a heatsink which cooperates with the at least one portion of the window to preserve the alignment of the substrate.

* * * * *